(12) United States Patent
Kwak et al.

(10) Patent No.: US 7,940,566 B2
(45) Date of Patent: May 10, 2011

(54) FLASH MEMORY DEVICE ADAPTED TO PREVENT READ FAILURES DUE TO DUMMY STRINGS

(75) Inventors: Pan-Suk Kwak, Hwaseong-si (KR); Hong-Soo Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 98 days.

(21) Appl. No.: 12/495,971

(22) Filed: Jul. 1, 2009

(65) Prior Publication Data

US 2009/0262580 A1    Oct. 22, 2009

Related U.S. Application Data

(62) Division of application No. 11/785,709, filed on Apr. 19, 2007, now Pat. No. 7,570,517.

(30) Foreign Application Priority Data

May 19, 2006  (KR) .................. 10-2006-0045275

(51) Int. Cl.
G11C 11/34        (2006.01)
(52) U.S. Cl. ............................. 365/185.17; 365/185.03

(58) Field of Classification Search ............. 365/185.17, 365/185.03, 185.11
See application file for complete search history.

(56) References Cited

U.S. PATENT DOCUMENTS

| 6,407,957 B2 | 6/2002 | Kasa |
| 6,807,110 B1 | 10/2004 | Wada |
| 6,850,439 B1 * | 2/2005 | Tanaka ................. 365/185.17 |
| 7,079,437 B2 * | 7/2006 | Hazama et al. ......... 365/210.12 |
| 7,177,191 B2 * | 2/2007 | Fasoli et al. ............ 365/185.17 |
| 2004/0113199 A1 | 6/2004 | Hazama et al. |

FOREIGN PATENT DOCUMENTS

| JP | 06267286 A | 9/1994 |
| JP | 2001256789 | 9/2001 |
| JP | 2003272377 A | 9/2003 |
| JP | 2004127346 | 4/2004 |
| JP | 2004303342 | 10/2004 |
| KR | 100167684 B1 | 9/1998 |
| KR | 1020010088298 A | 9/2001 |
| KR | 1020030008806 A | 1/2003 |

* cited by examiner

*Primary Examiner* — Anh Phung
(74) *Attorney, Agent, or Firm* — Volentine & Whitt, PLLC

(57) ABSTRACT

In a NAND flash memory device, a dummy NAND string is arranged between a plurality of normal NAND strings. A dummy bit line connected to the dummy NAND string is formed and/or controlled such that when program voltages are applied to the normal NAND strings, memory cells within the dummy NAND string are not programmed.

8 Claims, 10 Drawing Sheets

A memory cell in a normal string

A memory cell in a dummy string

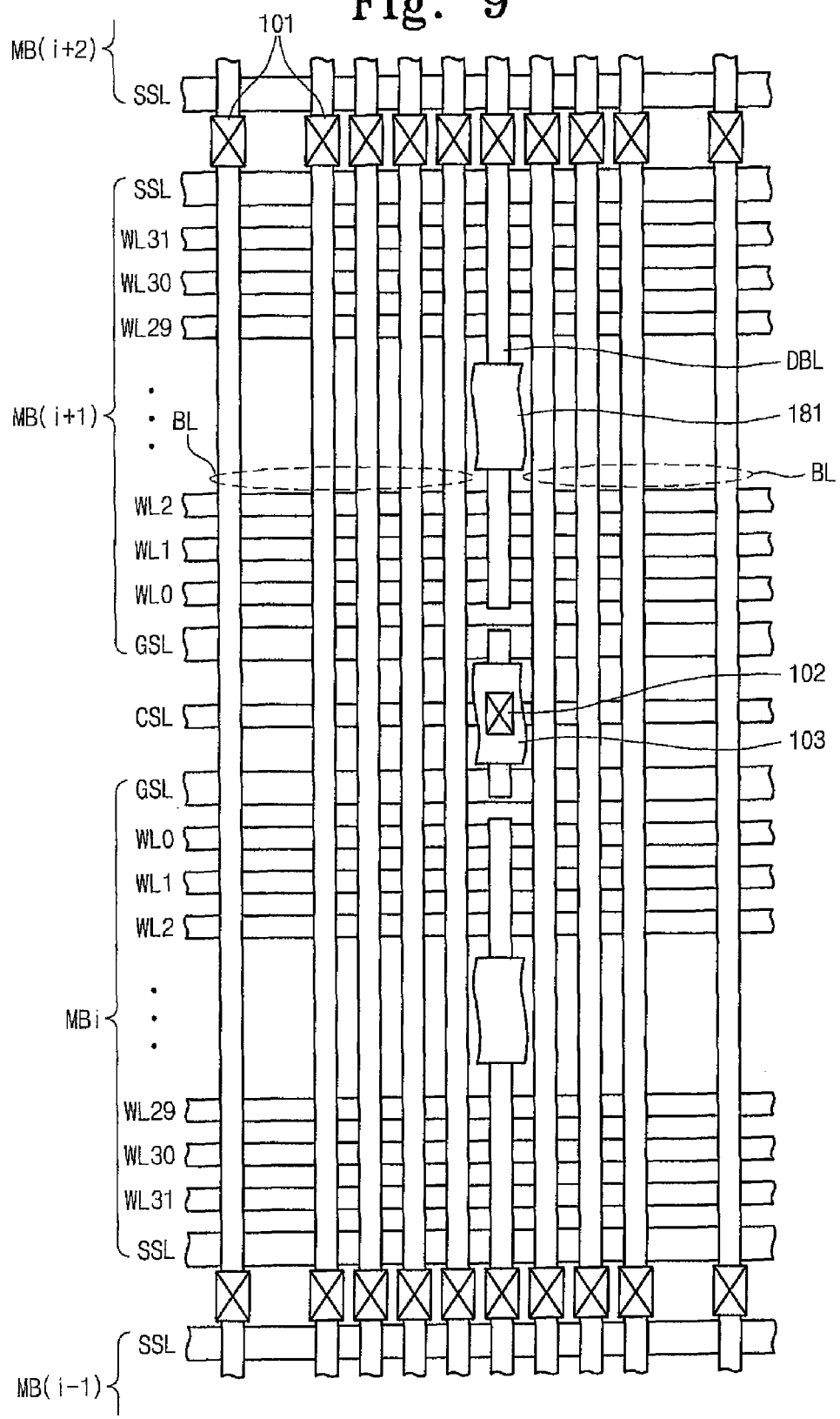

FLASH MEMORY DEVICE ADAPTED TO PREVENT READ FAILURES DUE TO DUMMY STRINGS

CROSS-REFERENCE TO RELATED APPLICATION

This is a divisional of application Ser. No. 11/785,709 filed on Apr. 19, 2007 now U.S. Pat. No. 7,570,517, issued on Aug. 4, 2009, which is incorporated herein by reference in its entirety.

BACKGROUND OF THE INVENTION

1. Field of the Invention

Embodiments of the invention relate generally to semiconductor memory devices. More particularly, embodiments of the invention relate to flash memory devices and related operating characteristics.

A claim of priority is made to Korean Patent Application No. 2006-45275 filed on May 19, 2006, the disclosure of which is hereby incorporated by reference.

2. Description of Related Art

Flash memory is a type of nonvolatile semiconductor memory. In recent years, flash memory has become a popular choice for providing data storage in portable electronic devices due, at least in part, to its ability to retain stored data when disconnected from an external power supply, its ability to withstand physical shock, its low power consumption, its relatively high degree of integration, and its relatively low cost.

In general, flash memory can be categorized into different types based on the organization of flash memory cells into different array structures and according to different read/program characteristics. For example, NAND flash memory devices and NOR flash memory devices each have different array structures and different read/program characteristics providing unique tradeoffs and advantages. In particular, NAND flash memory devices tend to have a higher degree of integration, but slower read times, than NOR flash memory devices. Accordingly, NAND flash memory devices are commonly used to provide mass data storage, while NOR flash memory devices are often used to provide storage for data requiring quick access, such as program code.

FIG. 1 is a block diagram illustrating a conventional NAND flash memory device. Referring to FIG. 1, the NAND flash memory device comprises a memory cell array comprising multiple memory blocks (labeled MB(n)). Each memory block comprises a plurality of NAND strings respectively corresponding to columns or bit lines of the NAND flash memory device. As illustrated in FIG. 1, the NAND strings within each memory block are connected to a common source line CSL.

FIG. 2 illustrates NAND strings within a memory block MBi of FIG. 1 in further detail. Referring to FIG. 2, each NAND string comprises a string select transistor SST, a ground select transistor GST, and memory cell transistors MC0 through MC31 connected in series between select transistors SST and GST.

FIG. 3 is a cross sectional view of a memory block MBi shown in FIG. 2. Referring to FIG. 3, memory block MBi is formed inside a pocket P-well 10. Pocket P-well 10 is formed inside a deep N-well 14 on a P-type substrate 12. An example of this triple well structure is disclosed in U.S. Pat. No. 5,962,888 entitled "WELL STRUCTURE NON-VOLATILE MEMORY DEVICE AND METHOD FOR FABRICATING THE SAME", the disclosure of which is hereby incorporated by reference.

NAND flash memory devices typically perform read and program operations in units of a page, and perform erase operations in units of a memory block. NAND flash memory devices are typically manufactured using complementary metal-oxide semiconductor (CMOS) manufacturing techniques. Semiconductor devices such as positive metal-oxide semiconductor (PMOS) and negative metal-oxide semiconductor (NMOS) transistors constituting peripheral circuits for the NAND flash memory devices are generally formed on a P-type semiconductor substrate.

Unfortunately, where memory cells constituting the memory cell array are formed on a P-type semiconductor substrate without additional processes, a high voltage can not be applied only to a substrate or bulk of the memory cells during an erase operation. Accordingly, the memory cell array is formed in pocket P-well 10, and pocket P-well 10 is formed on deep N-well 14 on P-type substrate 12 using a conventional ion implantation process. During program and read operations, pocket P-well 10 is biased with 0V (e.g., is connected to ground), and during erase operations, pocket P-well 10 is biased with a high voltage such as 20V.

In order to provide a large data storage capacity, the NAND flash memory device must include a large number of memory cells. However, as the number of the memory cells in the device increases, the number of memory cells connected to each row, or the number of strings or bit lines tends to increase. As the number of the strings or bit lines increases, the length of common source line CSL tends to increase accordingly. As the length of common source line CSL increases, resistance in common source line CSL tends to increase as well. Unfortunately, increased resistance in common source line CSL can increase an amount of time required for current to flow through the each NAND string of the NAND flash memory device during read operations. As a result, the lengthening of common source line CSL tends to increase the time required to read data from the NAND flash memory device.

The resistance of common source line CSL can be reduced by a strapping technique. In the strapping technique, metal lines are arranged along common source line CSL and are formed in contact with common source line CSL. The metal lines are called "strapping lines". An example of the strapping technique is disclosed in U.S. Pat. No. 6,611,460 entitled "NONVOLATILE SEMICONDUCTOR MEMORY DEVICE AND PROGRAMMING METHOD THEREOF", the disclosure of which is hereby incorporated by reference.

Although not illustrated in FIGS. 1 through 3, the strapping lines may be connected to common source line CSL through metal lines connected within dotted ovals "A" and "B" along a dummy bit line DBL illustrated in FIG. 1. Within each memory block in FIG. 1, a dummy string DS is disposed between common source line CSL and a dummy bit line. Although only one dummy string DS is illustrated in each memory block of FIGS. 1 and 2, the number of dummy strings in each memory block can vary according to the number of the bit lines or columns.

In each memory block, dummy string DS has a structure substantially identical to that of the NAND strings. For example, as illustrated in FIG. 2, each dummy string DS typically comprises a string select transistor SST, a ground select transistor GST, and memory cell transistors MC0 through MC31 connected in series between select transistors SST and GST. Transistors SST, GST, and MC0 through MC31 of dummy string DS are connected to signal lines SSL, GSL, and WL0 through WL31, respectively.

The dummy bit line in FIG. 1 is divided into a plurality of dummy bit line segments DBL, where each of dummy bit line segments DBL is arranged across two adjacent memory blocks (e.g., MBi and MB(i+1)). Dummy bit line segments DBL are electrically connected to a power supply line 11 (See, FIG. 2) to supply a well bias voltage VPPWELL for biasing pocket P-well 10. Dummy bit line segments DBL each receive well bias voltage VPPWELL with a fixed level during read, program, and erase operations. Unfortunately, where each dummy bit line segment DBL is connected to well bias voltage VPPWELL, a variety of problems may occur.

As mentioned above, pocket P-well 10 is connected to ground during program and read operations. Where pocket P-well 10 is connected to ground during a program operation, dummy bit line segment DBL is also connected to ground. Where a program voltage Vpgm is applied to word lines connected to memory cells within a dummy string DS during the program operation, those memory cells become programmed. In other words, the threshold voltages of those memory cells is increased.

Unfortunately, where memory cells within a dummy string are programmed, electrons stored in floating gates of those memory cells can affect the threshold voltages of memory cells in adjacent NAND strings due to capacitative coupling. For instance, FIG. 4 illustrates a capacitative interaction between a memory cell in a "normal" NAND string and a memory cell in a "dummy" NAND string. As shown by the threshold voltage diagram at the bottom of FIG. 4, the capacitative interaction can cause the threshold voltage of the memory cell in the normal NAND string to increase as illustrated by a right-pointing arrow. In general, the capacitative interaction can be referred to as "electric field coupling" or "F-poly coupling". This interaction can cause read failures to occur, especially in devices having relatively small read margins such as multi-bit memory cells.

SUMMARY OF THE INVENTION

According to an embodiment of the invention, a NAND flash memory device comprises a memory block comprising a plurality of first NAND strings and a second NAND string arranged between a pair of adjacent NAND strings among the plurality of first NAND strings. The device further comprises a plurality of first bit lines respectively electrically connected to the plurality of first NAND strings, a second bit line corresponding to the second NAND string, a common source line electrically connected to the first NAND strings and to the second NAND string, and a strapping line electrically connected to the common source line via the second bit line. The second bit line comprises a first bit line segment electrically connected to the common source line via a first contact, a second bit line segment electrically connected to the second NAND string via a second contact, and a third bit line segment arranged between the first contact and the second contact and electrically separated from the first and second bit line segments.

According to another embodiment of the invention, a NAND flash memory device comprises a memory cell array comprising a plurality of memory blocks formed on a pocket P-well, wherein each of the memory blocks comprises a plurality of first NAND strings and a second NAND string arranged between a pair of adjacent NAND strings among the plurality of first NAND strings. The device further comprises a plurality of first bit lines arranged in the memory cell array and respectively electrically connected to the first NAND strings in each of the memory blocks, a second bit line arranged in the memory cell array and corresponding to the second NAND string, a common source line electrically connected to the first NAND strings and the second NAND string, and a strapping line electrically connected to the common source line via the second bit line. The second bit line comprises a first bit line segment electrically connected to the common source line via a first contact, a second bit line segment electrically connected to the second NAND string via a second contact, and a third bit line segment arranged between the first contact and the second contact and electrically separated from the first and second bit line segments.

According to still another embodiment of the invention, a NAND flash memory device comprises at least one memory block comprising a plurality of first NAND strings and a second NAND string, wherein the second NAND string is arranged between a pair of adjacent NAND strings among the plurality of first NAND strings, a common source line respectively electrically connected to the plurality of first NAND strings and the second NAND string, a plurality of first bit lines respectively electrically connected to the plurality of first NAND strings, a second bit line corresponding to the second NAND string and comprising a first bit line segment electrically connected to the common source line through a first contact, and a second bit line segment electrically connected to the second NAND string and electrically separated from the first bit line segment, a strapping line electrically connected to the common source line through the first bit line segment and the first contact, and a first bias circuit biasing the second bit line segment with a power supply voltage during a program operation of memory cells in the plurality of first NAND strings to prevent memory cells in the second NAND string from being programmed.

BRIEF DESCRIPTION OF THE DRAWINGS

Embodiments of the invention are described below in relation to the accompanying drawings. Throughout the drawings, like reference numbers indicate like exemplary elements, components, and steps. In the drawings:

FIG. 9 is a plan view of a memory cell array in the NAND flash memory device of FIG. 8.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 5:
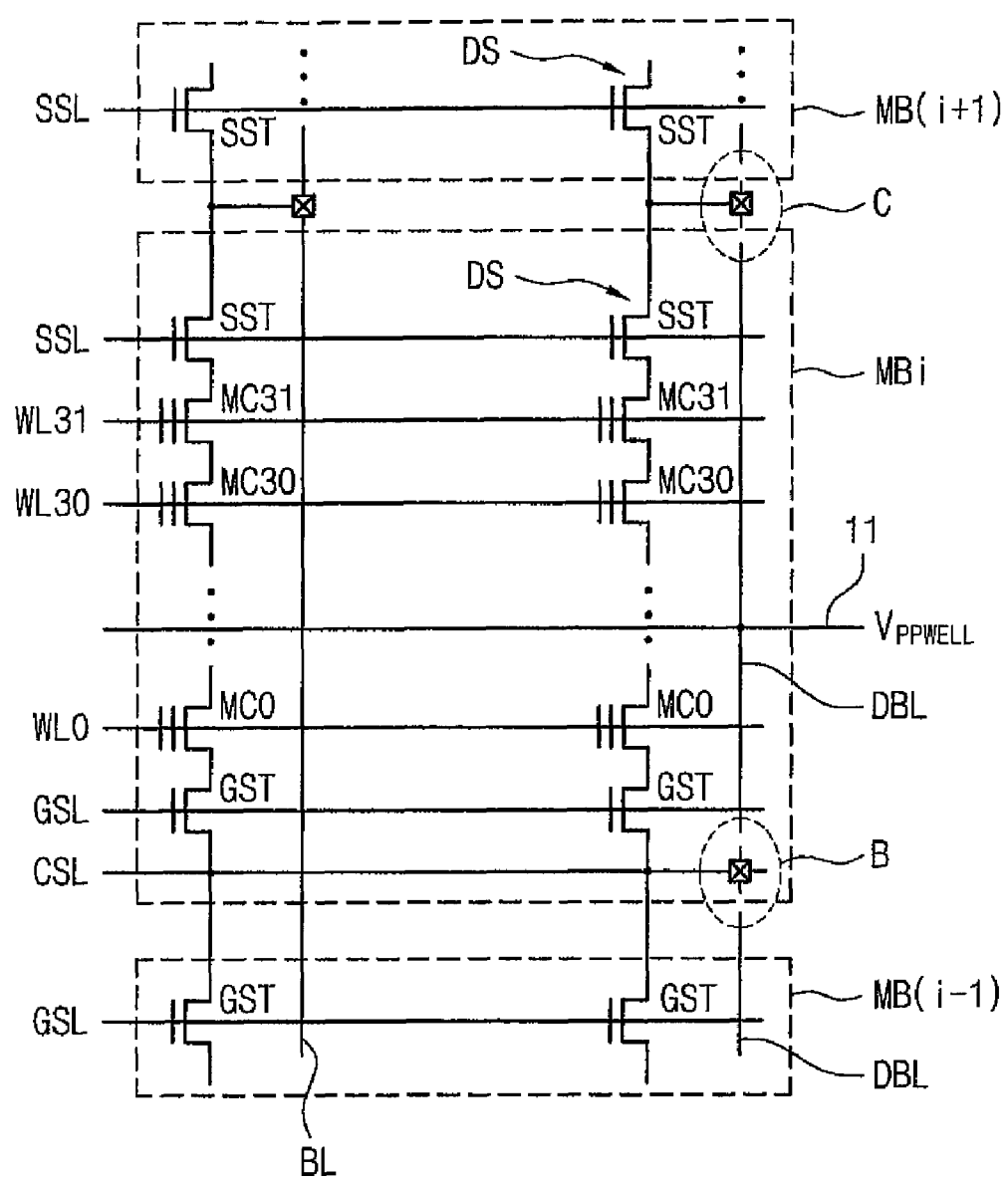
FIG. 5 is a circuit diagram of an array structure of a NAND flash memory device according to one embodiment of the invention.

FIG. 5 is a circuit diagram of an array structure of a NAND flash memory device according to one embodiment of the present invention. Referring to FIG. 5, the NAND flash memory device comprises a plurality of memory blocks. Each of the memory blocks comprises a plurality of NAND strings (referred to hereafter as normal strings) respectively connected to corresponding bit lines. Although only three memory blocks MB(i−1), MBi, and MB(i+1) are illustrated in FIG. 5, more memory blocks may be provided.

The memory blocks shown in FIG. 5 share the bit lines. In general, each normal string of each memory block comprises a string select transistor SST adapted to connect the normal string to a corresponding bit line BL, and a ground select transistor GST adapted to connect the normal string to a common select line CSL.

Each memory block in FIG. 5 further comprises at least one dummy string DS. The number of dummy strings DS may vary according to the number of bit lines or columns in the memory cell array. For example, one dummy string DS may be included for each group of 256 bit lines. Each dummy string DS has a structure substantially identical to that of the normal strings.

Common source line CSL is connected to one or more strapping lines adapted to reduce its resistance. For example, common source line CSL is connected to a strapping line within a dotted oval "B" in FIG. 5.

Figure 1:
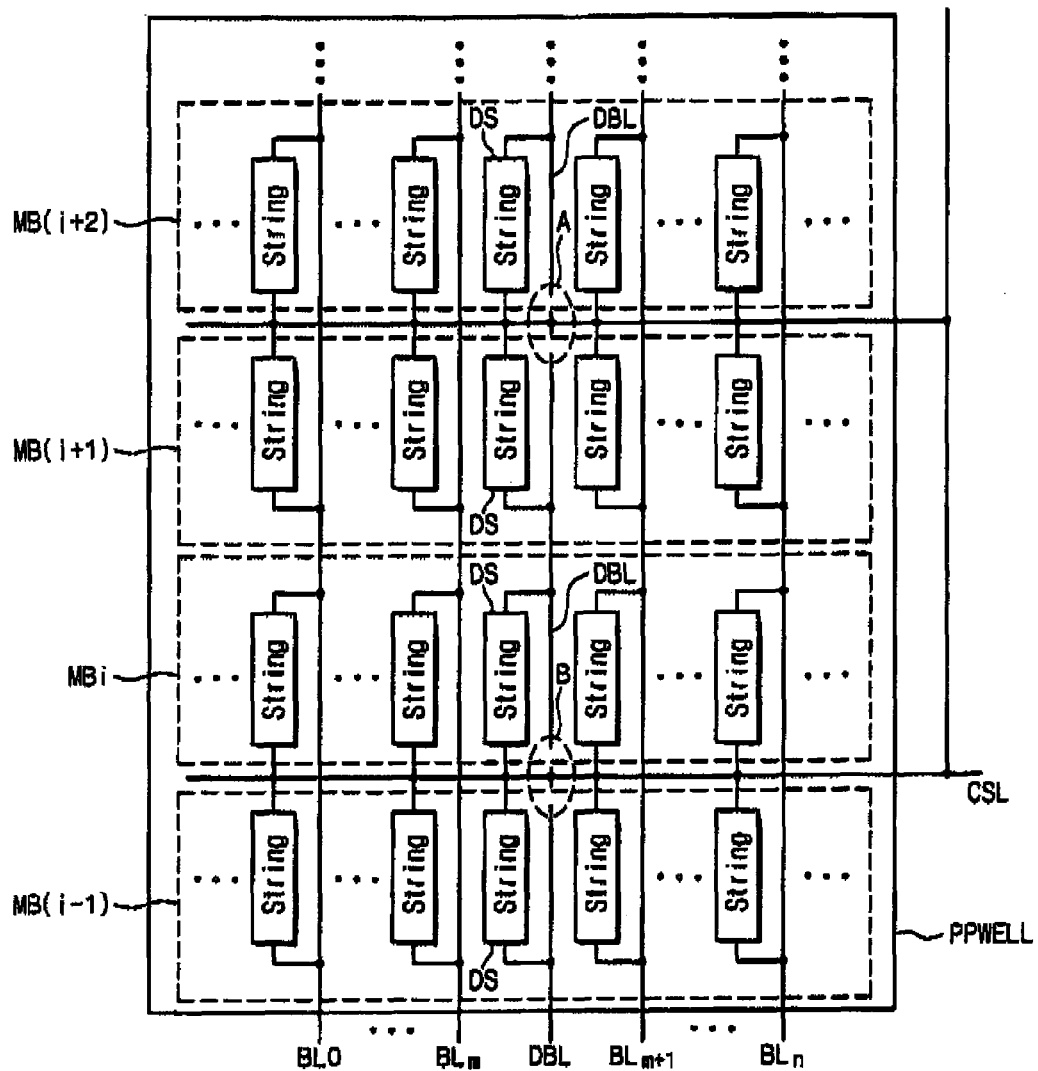
FIG. 1 is a block diagram illustrating an array structure of a conventional NAND flash memory device.
Figure 2:
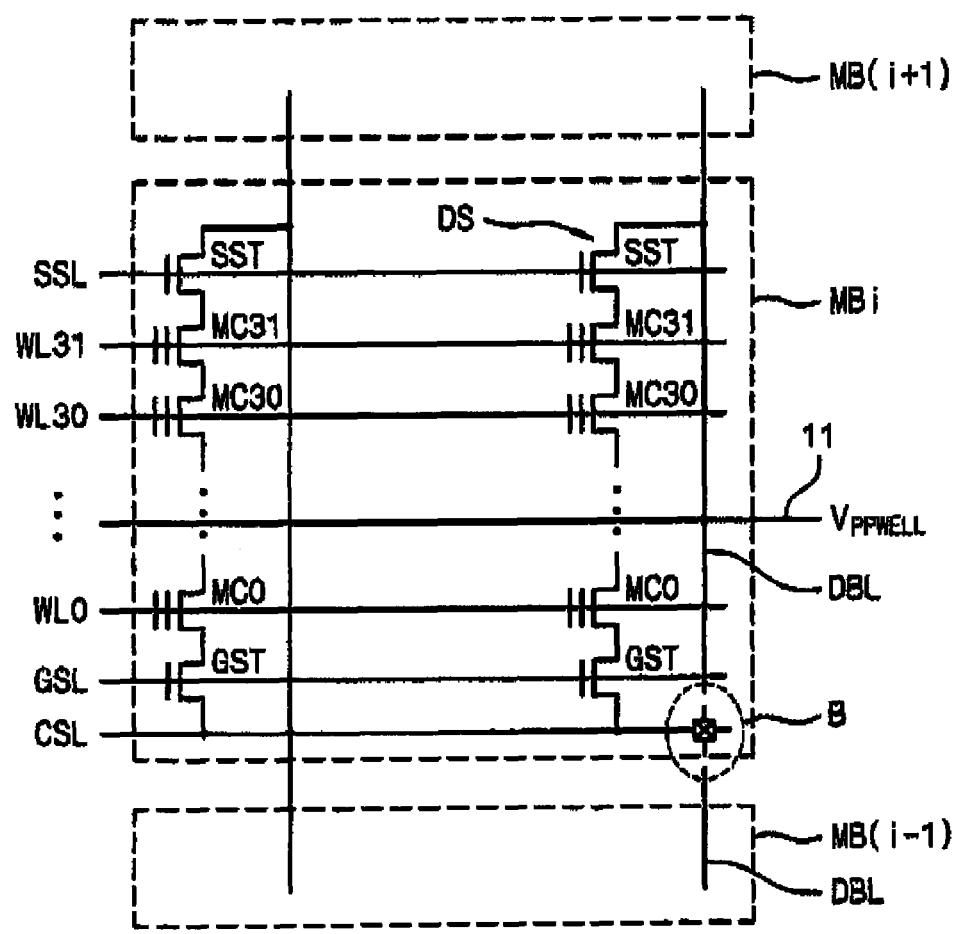
FIG. 2 is a circuit diagram illustrating NAND strings within a memory block shown in FIG. 1.
Figure 3:
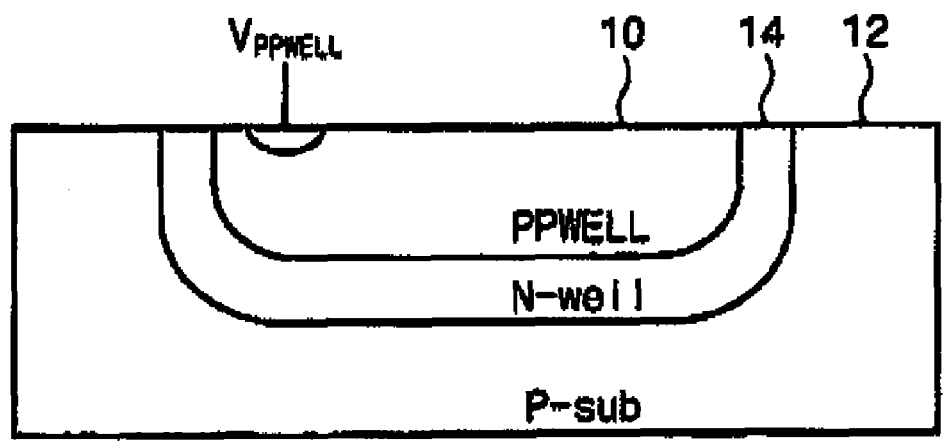
FIG. 3 is a cross-sectional view of the NAND flash memory device of FIG. 1.
Figure 4:
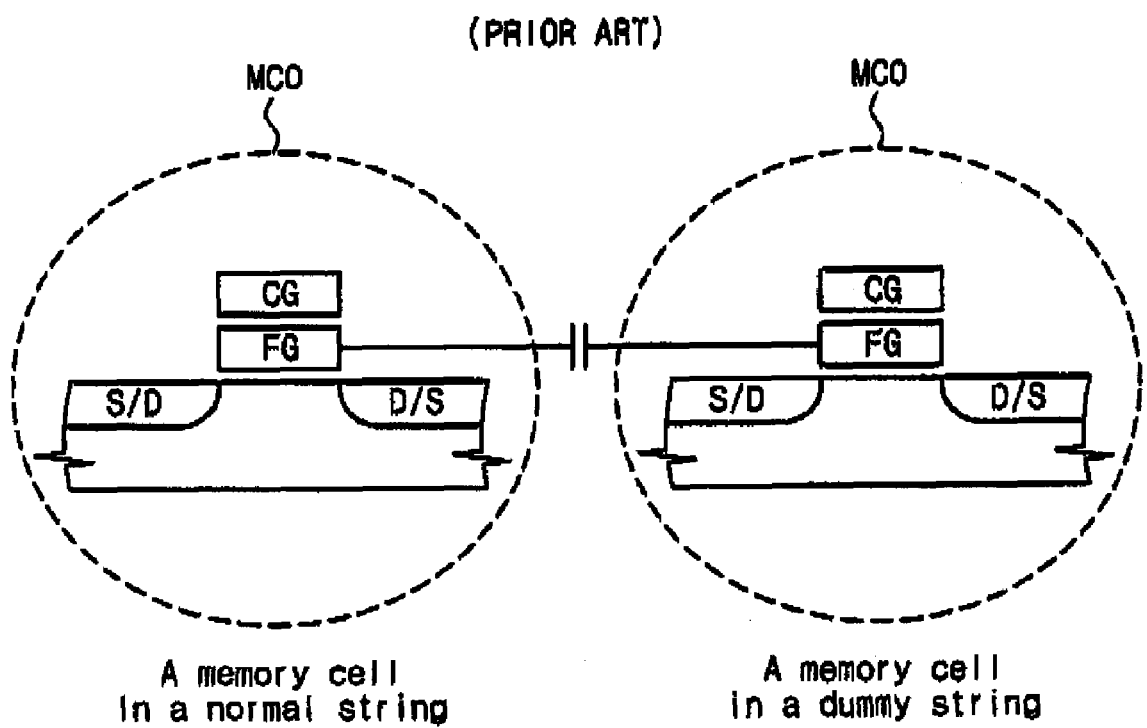
FIG. 4 is a diagram illustrating an electric field coupling between adjacent flash memory cells in the NAND flash memory device of FIG. 1.
Figure 4:
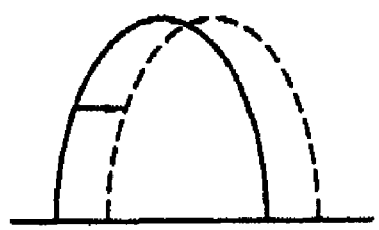

In the NAND flash memory device illustrated in FIG. 5, dummy strings DS are prevented from being programmed during program operations of the normal strings. The dummy string DS within each memory block is prevented from being programmed by being electrically disconnected from the corresponding dummy bit line segment DBL. Within a dotted oval "C" of FIG. 5, the dummy string DS is disconnected from the dummy bit line segment DBL such that a string select transistor SST of the dummy string DS in each memory block is electrically separated from the corresponding dummy bit line segment DBL. As illustrated in FIG. 2, the dummy bit line segment DBL is connected to a power supply line 11 to supply well bias voltage VPPWELL to pocket P-well 10.

According to the array structure illustrated in FIG. 5, where selected memory cells in normal strings are programmed, memory cells in dummy strings DS are not programmed because channel regions of the dummy strings DS remain in a floating state. As a result, the threshold voltages of memory cells in normal string adjacent to dummy strings DS are not affected by programming of dummy strings DS. Accordingly, read failures are prevented from occurring in memory cells of normal strings adjacent to dummy strings DS.

Figure 6:
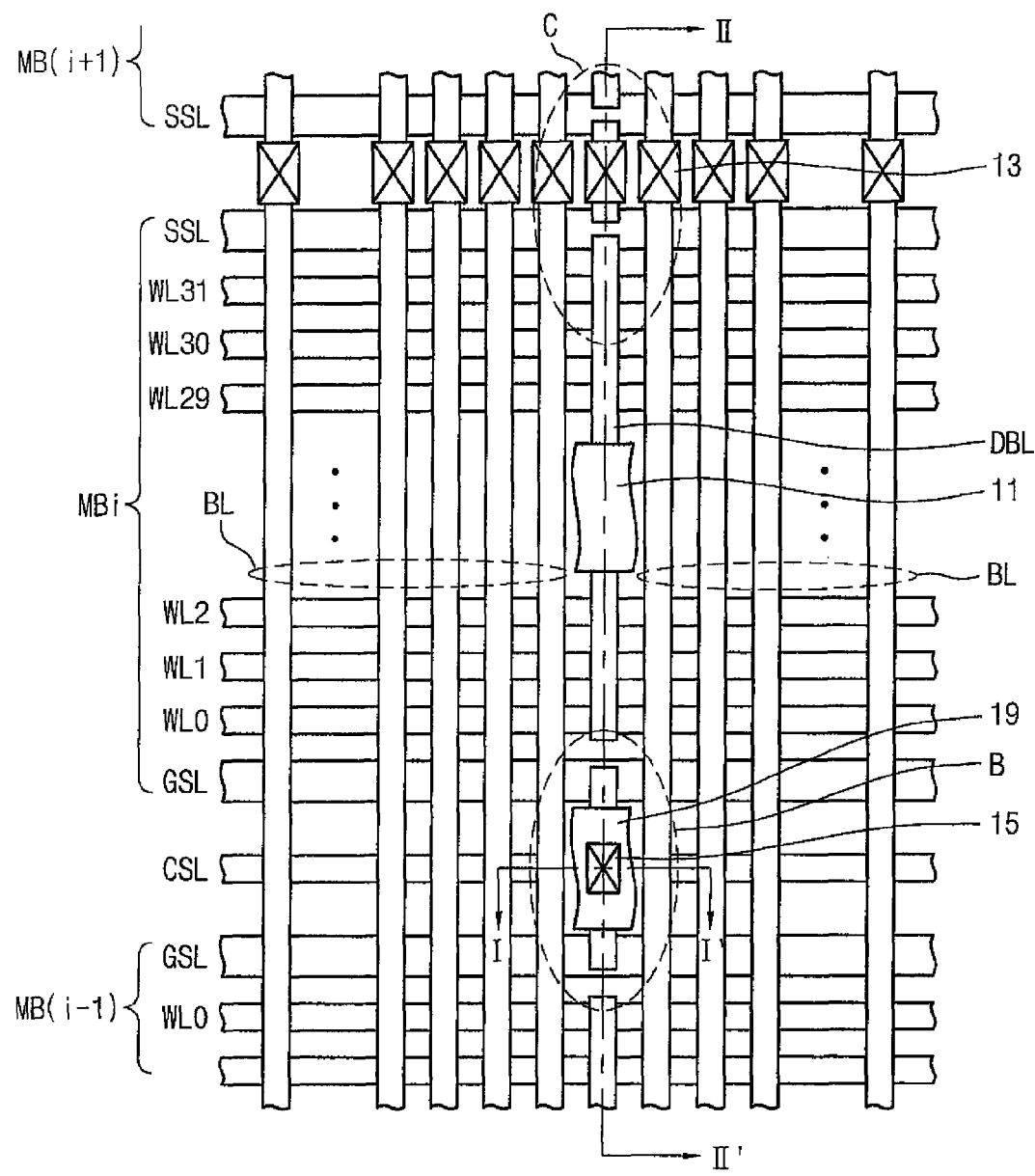
FIG. 6 is a plan view of the array structure of FIG. 5.
Figure 7A:
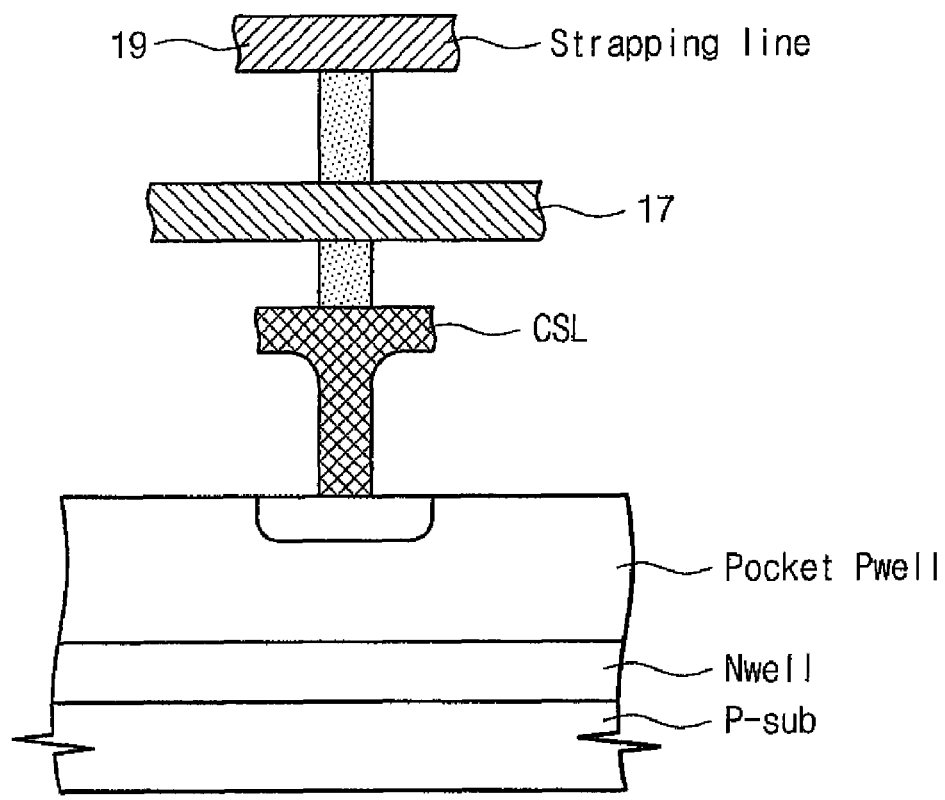
FIG. 7A is a cross-sectional view taken along a line I-I' in FIG. 6.
Figure 7B:
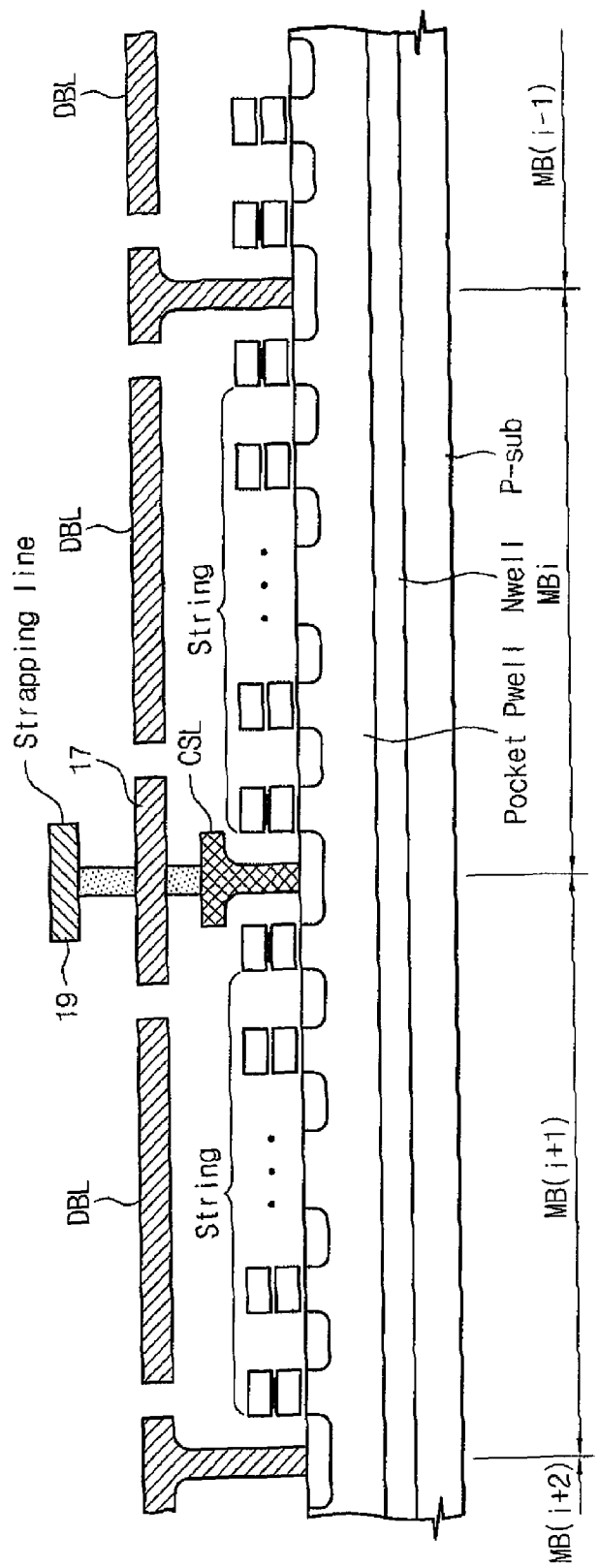
FIG. 7B is a cross-sectional view taken along a line II-II' in FIG. 6.

FIG. 6 is a plan view of the array structure of FIG. 5. FIG. 7A is a sectional view taken along a line I-I' in FIG. 6. FIG. 7B is a sectional view taken along a line II-II' in FIG. 6.

Referring to FIG. 6, normal and dummy strings share signal lines SSL, WL31 through WL0, and GSL in each memory block. Normal strings are electrically connected to corresponding bit lines BL, respectively, through drains of corresponding string select transistors and contacts 13 (hereinafter, referred to as drain-bit line contacts). Additionally, common source line CSL, as shown within dotted oval "B", is electrically connected to a metal line 17 (See, FIG. 7A) forming part of a dummy bit line, through a contact 15 (hereinafter, referred to as a CSL_BL contact). Metal line 17 is connected to a strapping line 19.

One of drain-bit line contacts 13 is connected to a corresponding dummy bit line segment DBL. However, CSL-BL contact 15 is disconnected from the corresponding dummy bit line segment DBL. This means that as illustrated in FIG. 7B, the corresponding dummy bit line segment DBL is arranged in a corresponding memory block and between drain-bit line contact 13 and CSL-BL contact 15. Although not illustrated, the corresponding dummy bit line segment DBL is electrically connected to power supply line 11 supplying well bias voltage VPPWELL.

Figure 8:
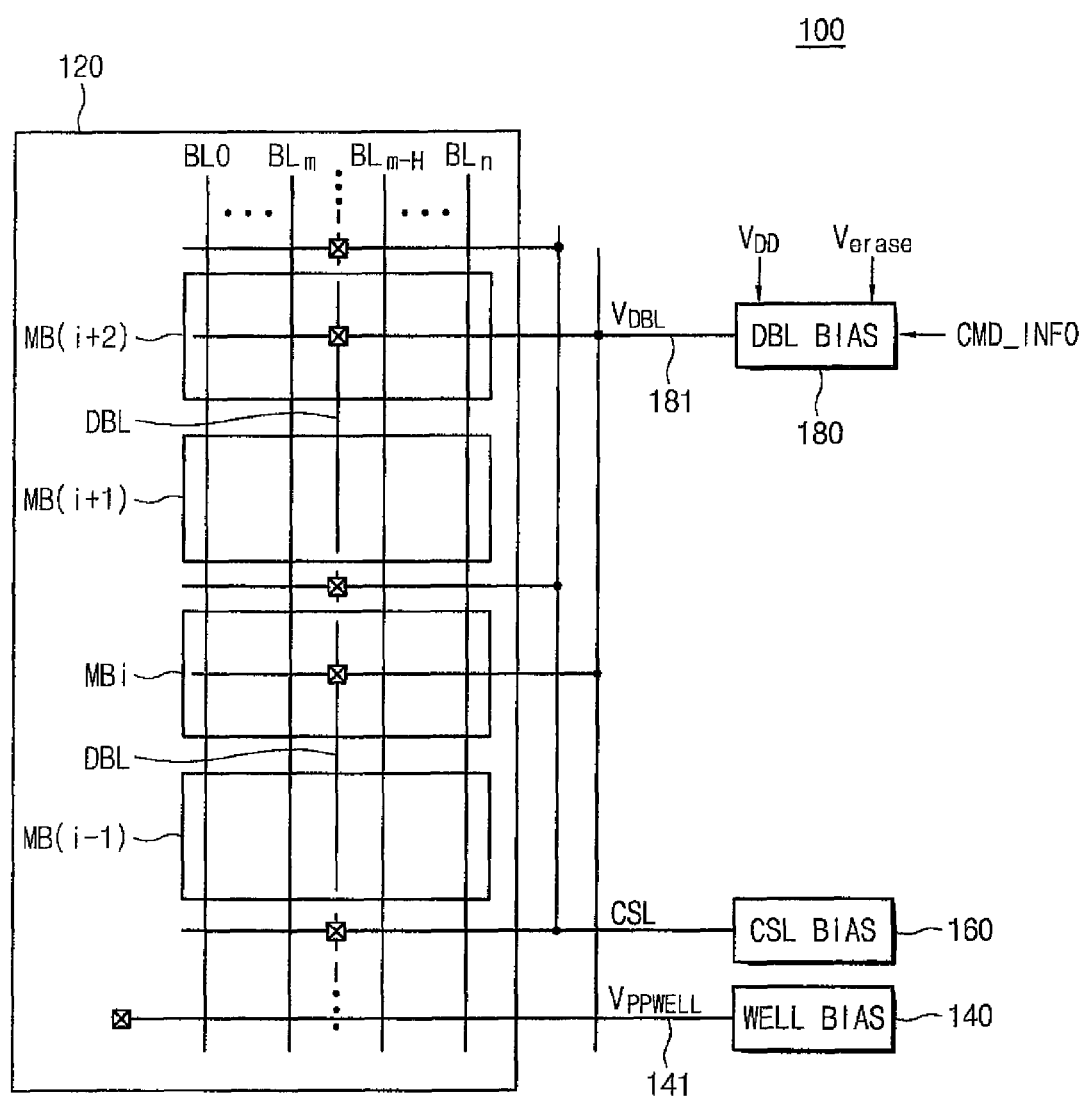
FIG. 8 is a block diagram of a NAND flash memory device according to an embodiment of the invention.

FIG. 8 is a block diagram of a NAND flash memory device according to another embodiment of the invention.

Referring to FIG. 8, a NAND flash memory device 100 comprises a memory cell array 120, a well bias circuit 140, a common source line bias circuit 160, and a dummy bit line bias circuit 180. Memory cell array 120 comprises a plurality of memory blocks. Each of the memory blocks in memory cell array 120 is similar to the memory blocks illustrated in FIG. 5 and includes a plurality of normal strings and at least one dummy string. The normal strings in each memory block are electrically connected to corresponding bit lines (e.g., BL0 through BLm, and BL(m+1) through BLn) via corresponding string select transistors.

The dummy string is connected to a dummy bit line comprising a plurality of dummy bit line segments DBL, where each dummy bit line segment DBL is arranged across a pair of adjacent memory blocks (e.g., between (MB(i−1) and MBi) and (MBi and MB(i+1))) located between common source lines CSL.

The memory blocks are formed in a pocket P-well similar to pocket P-well 10 described above. The pocket P-well receives well bias voltage VPPWELL through a power supply line 141 connected to well bias circuit 140. It should be noted that the arrangement or power supply line 141 could be modified, for example, by using a method disclosed in U.S. Pat. No. 6,611,460.

Well bias circuit 140 supplies well bias voltage VPPWELL as a ground voltage during program and read operations, and supplies an erase voltage (e.g., 20V) as well bias voltage VPPWELL into pocket P-well during erase operations. Common source line bias circuit 160 supplies common source line CSL with the ground voltage during program and read operations.

Dummy bit line bias circuit 180 generates a bit line bias voltage VDBL to bias power line 181 connected to dummy bit line segments DBL according to an operation mode (or, command information) of NAND flash memory device 100. Dummy bit line bias circuit 180 generates bit line bias voltage VDBL with a power supply voltage VDD during program operations. Dummy bit line bias circuit 180 generates dummy bit line bias voltage VDBL with a ground voltage GND during a read operations. Dummy bit line bias circuit 180 generates dummy bit line bias voltage VDBL with an erase voltage Verase during erase operations.

Where a dummy bit line segment DBL in a memory block selected during a program operation is driven with power supply voltage VDD, memory cells in a dummy string DS within the selected memory block are not programmed due to a self-boosting scheme. Examples of the self-boosting scheme are disclosed in U.S. Pat. No. 5,677,873 entitled "METHOD OF PROGRAMMING FLASH EEPROM INTEGRATED CIRCUIT MEMORY DEVICES TO PREVENT INADVERTENT PROGRAMMING OF NONDESIGNATED NAND MEMORY CELLS THEREON" and in U.S. Pat. No. 5,991,202 entitled "METHOD FOR REDUCING PROGRAM DISTURB DURING SELF-BOOTING IN A NAND FLASH MEMORY", the respective disclosures of which are incorporated by reference.

In NAND flash memory device 100, where memory cells of normal strings are programmed, memory cells of dummy strings DS are not programmed because channel regions of the dummy strings DS are maintained in a floating state (or, the channel regions of the dummy strings DS are biased with voltages VDD and Vth). As a result, threshold voltages of memory cells adjacent to the dummy strings DS are not affected by the electrical charges in memory cells of the dummy strings DS. Accordingly, read failures of the memory cells in the normal strings adjacent to the dummy strings DS are prevented.

FIG. 9 is a plan view of a memory cell array in NAND flash memory device 100 of FIG. 8. Referring to FIG. 9, normal and dummy strings share same signal lines SSL, WL31 through WL0, and GSL in each memory block. Normal and dummy strings are electrically connected to corresponding bit lines through respective drains of corresponding string select transistors and contacts 101 (hereinafter, referred to as a drain-bit line contact) between the bit lines.

Common source line CSL is electrically connected to a metal line 103 forming part of a bit line, through a contact 102 (i.e., a CSL-BL contact). Metal line 103 is connected to a strapping line such as that illustrated in FIG. 7A. However, dummy bit line segments DBL are electrically separated from CSL-BL contact 102.

Those of ordinary skill in the art will understand that various changes in form and details may be made to the above embodiments of the invention without departing from the scope of the invention as defined by the claims. For example, an arrangement of power line 181 may be varied such that power line 181 is connected to the each memory block instead of every other memory block, as shown in FIG. 8. In this case, the dummy bit line bias circuit 180 may generate dummy bit line bias voltage VDBL according to each memory block being programmed. For example, the dummy bit line bias circuit 180 may supply a dummy bit line bias voltage VDBL to a dummy bit line segment DBL of a selected memory block based on block selecting information such as a block address.

As described above, when selected memory cells of normal strings are programmed, memory cells within dummy strings are prevented from being programmed by maintaining channel regions of the dummy strings in a floating state. Accordingly, the threshold voltages of memory cells in normal strings adjacent to dummy strings are prevented from being modified by electrical interactions with memory cells in the dummy strings, and therefore read failures are prevented.

What is claimed is:

1. A NAND flash memory device comprising:
    at least one memory block comprising a plurality of first NAND strings and a second NAND string, wherein the second NAND string is arranged between a pair of adjacent NAND strings among the plurality of first NAND strings;
    a common source line respectively electrically connected to the plurality of first NAND strings and the second NAND string;
    a plurality of first bit lines respectively electrically connected to the plurality of first NAND strings;
    a second bit line corresponding to the second NAND string and comprising a first bit line segment electrically connected to the common source line through a first contact, and a second bit line segment electrically connected to the second NAND string and electrically separated from the first bit line segment;
    a strapping line electrically connected to the common source line through the first bit line segment and the first contact; and,
    a first bias circuit biasing the second bit line segment with a power supply voltage during a program operation of memory cells in the plurality of first NAND strings to prevent memory cells in the second NAND string from being programmed.

2. The NAND flash memory device of claim 1, wherein the memory block is formed on a pocket P-well whereon the memory block is formed.

3. The NAND flash memory device of claim 2, wherein the first bias circuit biases the second bit line segment with a ground voltage during a read operation.

4. The NAND flash memory device of claim 3, wherein the first bias circuit biases the second bit line segment with an erase voltage applied to the pocket P-well during an erase operation.

5. The NAND flash memory device of claim 2, further comprising:
    a second bias circuit biasing the common source line; and
    a third bias circuit biasing the pocket P-well.

6. The NAND flash memory device of claim 1, further comprising a second memory block, comprising:
    a third NAND string electrically connected to the second bit line segment; and
    a plurality of fourth NAND strings respectively electrically connected to the plurality of first bit lines.

7. The NAND flash memory device of claim 1, wherein the at least one memory block comprises multiple memory blocks divided into pairs of adjacent memory blocks; and
    wherein each pair of adjacent memory blocks shares a contiguous bit line segment connected to the second NAND strings of the memory blocks in the pair.

8. The NAND flash memory device of claim 1, wherein one or more of the plurality of first strings comprises one or more multi-level memory cells.

* * * * *